(12) United States Patent
Watanabe (10) Patent No.: US 7,477,684 B2
(45) Date of Patent: Jan. 13, 2009

(54) TESTING METHOD, COMMUNICATION DEVICE, AND TESTING SYSTEM

(75) Inventor: Daisuke Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 451 days.

(21) Appl. No.: 11/335,906

(22) Filed: Jan. 19, 2006

(65) Prior Publication Data

US 2006/0209710 A1 Sep. 21, 2006

Related U.S. Application Data (63) Continuation of application No. PCT/JP2004/010963, filed on Jul. 30, 2004.

(30) Foreign Application Priority Data

Aug. 4, 2003 (JP) .............................. 2003-286040

(51) Int. Cl.
*H04B 3/46* (2006.01)
(52) U.S. Cl. ........................................ 375/224; 702/79
(58) Field of Classification Search ................ 375/224, 375/226, 227, 228; 702/79, 125, 176
See application file for complete search history.

(56) References Cited

U.S. PATENT DOCUMENTS

| 6,278,755 | B1 | 8/2001 | Baba et al. |
| 2005/0001648 | A1* | 1/2005 | Yamamoto ................. 324/772 |
| 2006/0020577 | A1* | 1/2006 | Oshima ........................ 707/3 |

FOREIGN PATENT DOCUMENTS

| JP | 1-154660 | 6/1989 |
| JP | 1-160237 | 6/1989 |
| JP | 4-54043 | 2/1992 |
| JP | 2004-289387 | 10/2004 |

OTHER PUBLICATIONS

International Search Report issued for International application No. PCT/JP2004/010963 mailed on Nov. 16, 2004 and English translation thereof, 4 pages.
Patent Abstracts of Japan, Publication No. 04-054043, Publication Date: Feb. 21, 1992, 2 pages.
Patent Abstracts of Japan, Publication No. 01-0160237, Publication Date: Jun. 23, 1989, 2 pages.
Patent Abstracts of Japan, Publication No. 01-154660, Publication Date: Jun. 16, 1989, 2 pages.
Patent Abstracts of Japan, Publication No. 2004-289387, Publication Date: Oct. 14, 2004, 2 pages.

* cited by examiner

*Primary Examiner*—Chieh M Fan
*Assistant Examiner*—Jaison Joseph
(74) *Attorney, Agent, or Firm*—Osha - Liang LLP (57) ABSTRACT

A testing method of a communication device according to the present invention comprises: a step for transmitting and receiving a test signal generated based on a reference clock; a step for generating an anticipated value of the test signal based on the reference clock; a step for delaying the test signal; a step for comparing the delay test signal with the anticipated value and outputting the comparison results; a step for repeatedly performing the above steps and storing the comparison results for each delay time; a step for detecting the eye opening for the test signal based on the comparison results for each delay time; and a step for determining the quality of the communication device based on the detected eye opening.

14 Claims, 7 Drawing Sheets

| DELAY TIME | 1Ch | 2Ch | 3Ch | · · · · · |
|---:|:---:|:---:|:---:|:---:|
| 0ps | 1 | 1 | 1 | · · · · · |
| 10ps | 1 | 1 | 1 | |
| 20ps | 1 | 1 | 1 | |
| 30ps | 1 | 0 | 1 | |
| 40ps | 1 | 0 | 1 | |
| 50ps | 1 | 0 | 0 | |
| 60ps | 1 | 0 | 0 | |
| 70ps | 1 | 0 | 0 | |
| 80ps | 1 | 0 | 0 | |
| 90ps | 0 | 0 | 0 | |
| 100ps | 0 | 0 | 0 | |
| 110ps | 0 | 0 | 0 | |
| 120ps | 0 | 0 | 0 | |
| ⋮ | ⋮ | ⋮ | ⋮ | |

# TESTING METHOD, COMMUNICATION DEVICE, AND TESTING SYSTEM

BACKGROUND OF THE INVENTION

1. Field of the Invention

The present invention relates to a testing method, a communication device, and a testing system. More particularly, the present invention relates to a testing method for testing communication devices at actual operating frequency.

This application claims the benefit of Japanese Application No. 2003-286040 filed Aug. 4, 2003, and PCT/JP No. 2004/10963 filed Jul. 30, 2004, which are hereby incorporated by reference herein in their entirety.

2. Description of the Related Art

There is a conventionally known testing method for detecting bit errors in signal transmission using a test signal generating unit and an anticipated signal comparing unit built into a communication device, and determining the quality of the communication device. With this testing method, the communication device at the transmitting side generates test signals and transmits to the communication device on the receiving side, and the receiving side communication device compares the test signals transmitted from the transmitting side communication device with anticipated values, thereby determining the quality of the transmitting side or receiving side communication device. As of now, the Present Assignee is not aware of any prior art documents, and accordingly no description of prior art documents will be made here.

With the conventional testing method, the receiving side communication device compares test signals transmitted from the transmitting side communication device with anticipated values at the generally center of a unit interval which is a cycle of a data unit of the test signals, and detects bit errors from the comparison results thereof. Accordingly, the factor of jitter properties is not taken into consideration in the bit error determination judgment. Thus, accurate bit error detection could not be performed in communication devices wherein bit errors occur due to slight disturbance factors, and it has been difficult to perform testing with high precision.

SUMMARY OF THE INVENTION

Accordingly, it is an object of the present invention to provide a testing method, communication device, and testing system, capable of solving the above problems. This object is achieved by combining the features described in the independent claims in the Claims. Also, the dependent claims lay forth further advantageous specific examples of the present invention.

To this end, according to a first aspect of the present invention, a testing method for testing a communication device comprises: a reference clock generating step for generating a reference clock; a test signal generating step for generating a test signal based on the reference clock; a transmitting step for transmitting, with a transmitting unit, the test signal generated in the test signal generating step; a receiving step for receiving, with a receiving unit, the test signal which the transmitting unit has transmitted in the transmitting step; an anticipated value generating step for generating, based on the reference clock, an anticipated value for the test signal which the receiving unit is to receive in the receiving step; a delay step for delaying the test signal which the receiving unit has received in the receiving step, as to the reference clock; a comparing step for comparing the test signal delayed in the delay step with the anticipated value generated in the anticipated value generating step, and outputting comparison results indicating matching or not matching; a comparison result storing step for storing the comparison result in the comparing step in a manner correlated with the delay time by which the test signal was delayed in the delay step; a repetition step for repeatedly performing the delay step, the comparing step, and the comparison result storing step, while changing the delay time for delaying the test signal in the delay step, and storing the comparison results for each delay time; a detecting step for detecting the range wherein the test signal delayed in the delay step and the anticipated value generated in the anticipated value generating step match, based on the comparison results for each delay time stored in the repetition step; and a determining step for determining quality of the receiving unit or the transmitting unit, based on the range of the delay time detected in the detecting step.

The repetition step may further comprise a step for changing the delay time for delaying the test signal in the delay step at predetermined timings; with the comparing step further comprising a step for sequentially comparing a plurality of data units which the test signal contains with the anticipated value; and the comparison result storing step further comprising a step for storing, in the event that at least one of the plurality of data units does not match the anticipated value, the comparison results indicating that the test signal received by the receiving unit in the receiving step does not match the anticipated value. The repetition step may further comprise a step for changing the delay time for the delay in the delay step over a range equal to or greater than the cycle of data units which the test signal, generated in the test signal generating step, contains. The determining step may further comprise a step for determining quality of the receiving unit or the transmitting unit based on whether or not the range of the delay time detected in the detecting step is equal to or greater than a predetermined stipulated value. The detecting step may further comprise a step for detecting, in an arrangement wherein the communication device comprises a plurality of the receiving units or a plurality of the transmitting units, the range of the delay time in which the test signal delayed in the delay step and the anticipated value generated in the anticipated value generating step match at all of the plurality of receiving units or the plurality of transmitting units, based on the comparison results for each delay time regarding the plurality of receiving units or the plurality of transmitting units.

According to a second aspect of the present invention, a testing method for testing a communication device comprises: a reference clock generating step for generating a reference clock; a delay clock generating step for generating a delay clock by delaying the reference clock; a test signal generating step for generating a test signal based on the delay clock; a transmitting step for a transmitting unit to transmit the test signal generated in the test signal generating step: a receiving step for a receiving unit to receive the test signal transmitted by the transmitting unit in the transmitting step; an anticipated value generating step for generating, based on the reference clock, an anticipated value of the test signal to be received by the receiving unit in the receiving step; a comparing step for comparing the test signal which the receiving unit has received in the receiving step with the anticipated value generated in the anticipated value generating step, and outputting comparison results indicating matching or not matching; a comparison result storing step for storing the comparison result in the comparing step in a manner correlated with the delay time by which the reference clock was delayed in the delay clock generating step; a repetition step for repeatedly performing the test signal generating step, the transmitting step, the receiving step, the comparing step, and the comparison result storing step, while changing the delay time for delaying the reference clock in the delay clock generating step, and storing the comparison results for each delay time; a detecting step for detecting the range wherein the test signal which the receiving unit has received in the receiving step and the anticipated value generated in the anticipated value generating step match, based on the comparison results for each delay time stored in the repetition step; and a determining step for determining quality of the receiving unit or the transmitting unit, based on the range of the delay time detected in the detecting step.

According to a third aspect of the present invention, a communication device comprises: a receiving unit for receiving test signals generated based on a reference clock; a variable delay unit for generating a delay clock by delaying the reference clock, while sequentially changing the delay time; a test signal delay unit for delaying the test signal which the receiving unit has received, based on the delay clock generated by the variable delay unit; an anticipated value generating unit for generating, based on the reference clock, an anticipated value for a test signal to be received by the receiving unit; and an anticipated value comparing unit for sequentially comparing the test signal delayed by the test signal delay unit and the anticipated value generated by the anticipated value generating unit, and sequentially outputting comparison results indicating matching or not matching.

The communication device may further comprise: a variable delay control unit for changing the delay time of the reference clock by the variable delay unit at predetermined timings; and a comparison result holding unit for holding the comparison results sequentially output from the anticipated value comparing unit for each the predetermined time, and in the event that the anticipated value comparing unit outputs at least one comparison result indicating that the test signal and the anticipated value do not match within the predetermined time, outputting the comparison results indicating that the test signal does not match the anticipated value.

The communication device may further comprise: an eye opening detecting unit for detecting the range of delay time in which the test signal delayed by the test signal delay unit and the anticipated value generated by the anticipated value generating unit match, based on the comparison results for each the delay time output from the comparison result holding unit; and a quality determining unit for determining the quality of the communication device, based on the range of the delay time detected by the eye opening detecting unit.

The variable delay unit may have a variable range equal to or greater than the cycle of data units contained in the test signal received by the receiving unit. The communication device may further comprise: a reference clock generating unit for generating the reference clock; a test signal generating unit for generating the test signal based on the reference clock generated by the reference clock generating unit; and a transmitting unit electrically connected to the receiving unit, for transmitting the test signal generated by the test signal generating unit to the receiving unit.

According to a fourth aspect of the present invention, a communication device comprises: a variable delay unit for generating a delay clock by delaying a reference clock while sequentially changing the delay time; a test signal generating unit for generating a test signal based on the delay clock; a transmitting unit for transmitting the test signal generated by the test signal generating unit; a receiving unit electrically connected to the transmitting unit, for receiving the test signal transmitted by the transmitting unit; an anticipated value generating unit for generating, based on the reference clock, an anticipated value for the test signal to be received by the receiving unit; and an anticipated value comparing unit for sequentially comparing the test signal received by the receiving unit with the anticipated value generated by the anticipated value generating unit, and sequentially outputting comparison results indicating whether matching or not matching.

According to a fifth aspect of the present invention, a test system, which transmits test signals generated based on a reference clock for testing a transmitting unit, comprises: a receiving unit for receiving the test signals transmitted by the transmitting unit; a variable delay unit for generating a delay clock by delaying the reference clock, while sequentially changing the delay time; a test signal delay unit for delaying, based on the delay clock generated by the variable delay unit, the test signal received by the receiving unit; an anticipate value generating unit for generating, based on the reference clock, an anticipated value for the test signal to be received by the receiving unit; an anticipated value comparing unit for sequentially comparing the test signal delayed by the test signal delay unit with the anticipated value generated by the anticipated value generating unit, and sequentially outputting comparison results indicating whether matching or not matching; a variable delay control unit for changing the delay time for delaying the reference clock by the variable delay unit, at predetermined timings; a comparison result holding unit for holding the comparison results sequentially output from the anticipated value comparing unit for each the predetermined time, and in the event that the anticipated value comparing unit outputs at least one comparison result indicating that the test signal and the anticipated value do not match within the predetermined time, outputting the comparison results indicating that the test signal does not match the anticipated value; an eye opening detecting unit for detecting the range of delay time in which the test signal delayed by the test signal delay unit and the anticipated value generated by the anticipated value generating unit match, based on the comparison results for each the delay time output from the comparison result holding unit; and a quality determining unit for determining the quality of the transmitting unit, based on the range of the delay time detected by the eye opening detecting unit.

The testing system may further comprise a receiving unit having the receiving unit, the anticipated value comparing unit, and the comparison result holding unit; with the receiving unit being provided detachably to the testing system.

Note that the above outline of the invention is not a comprehensive description of all features of the present invention, and that sub-combinations of these feature groups are also encompassed in the invention.

DETAILED DESCRIPTION OF THE INVENTION

The present invention will now be described by way of embodiments; however, it should be understood that the following embodiments should be interpreted illustratively and not restrictively. Further, the combinations of features described in the embodiments are not all necessarily indispensable to the present invention.

Figure 1:
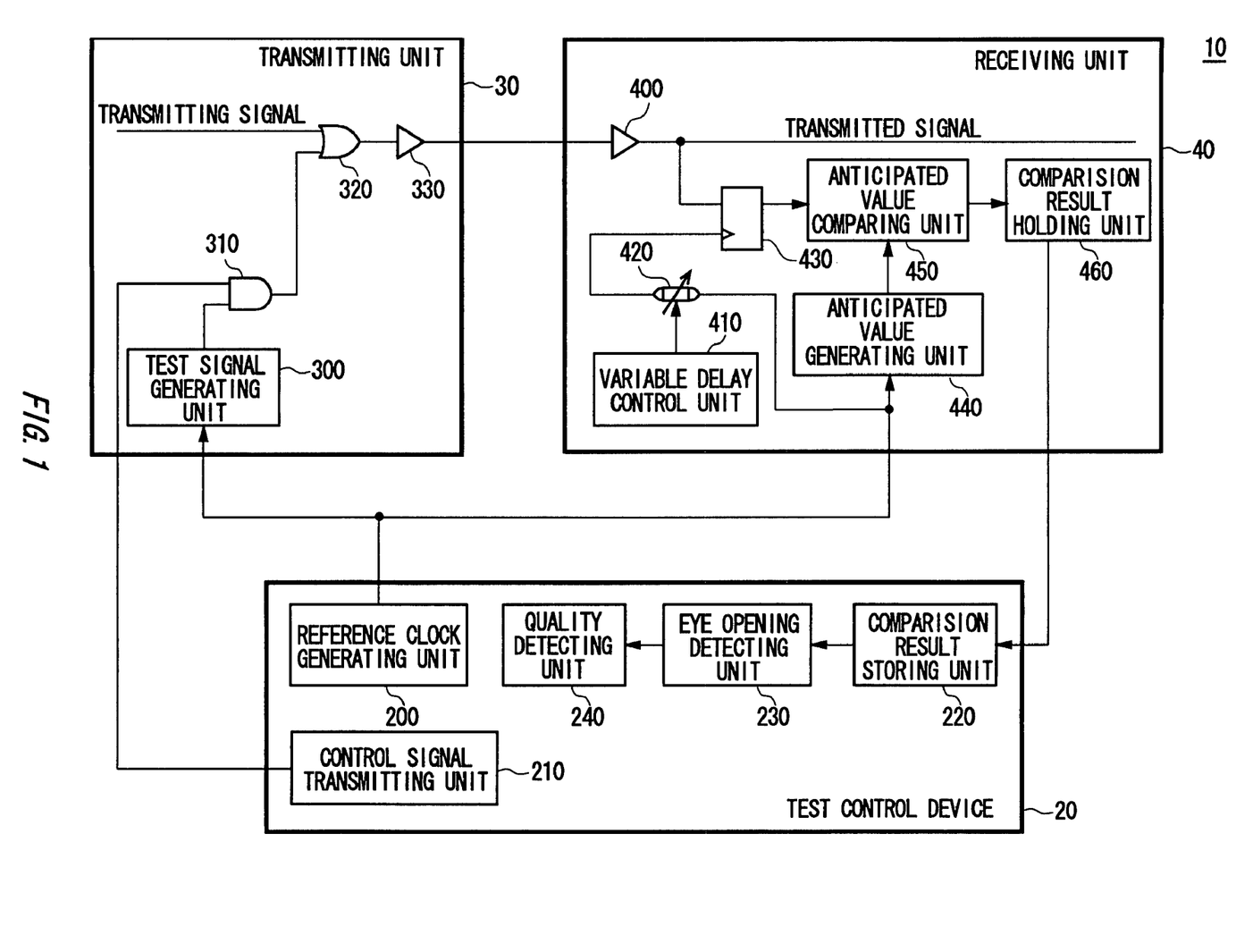
FIG. 1 is a diagram illustrating an example of the configuration of a testing system 10.

FIG. 1 illustrates an example of a configuration of a testing system 10 according to a first embodiment of the present invention. It is an object of the testing system 10 according to the present embodiment to perform signal transmission testing at actual operating frequency for communication devices including a transmitting unit 30 and/or receiving unit 40, thereby detecting the eye opening at the actual operating frequency of the communication device in a simulated manner.

The testing system 10 comprises a transmitting unit 30 for generating and transmitting test signals and a receiving unit 40 for receiving the testing signals which the transmitting unit 30 has transmitted and comparing these with an anticipated value, and a test control device 20 which controls the testing actions of the transmitting unit 30 and the receiving unit 40. The transmitting unit 30 and the receiving unit 40 may be provided on a single communication device and be electrically connected by so-called loop-back connection, or may be provided on different communication devices, with the communication devices being electrically connected one to another.

The test control device 20 has a reference clock generator 200 and a control signal transmitter 210. The reference clock generator 200 generates a reference clock, which is supplied to the transmitting unit 30 and the receiving unit 40. For example, the reference clock generator 200 generates a reference clock of actual operating frequency for the transmitting unit 30 and the receiving unit 40. Examples of the reference clock generator 200 include a quartz oscillator or signal generator provided on a performance board, and an oscillator circuit assembled within the testing system 10. Also, the reference clock generator 200 may be provided in the communication device where the transmitting unit 30 and/or the receiving unit 40 are provided, and the test control device 20 may control the frequency and the like of the reference clock which the reference clock generator 200, provided in the communication device, generates. The control signal transmitter 210 generates and transmits control signals to the transmitting unit 30, to instruct the transmitting unit 30 to perform transmission of test signals. For example, the control signal transmitter 210 transmits a control signal with a logical value "1" when performing test operations, and transmits a control signal with a logical value "0" under non-test operations, i.e., when performing normal operations.

The transmitting unit 30 has a test signal generator 300, AND circuit 310, OR circuit 320, and driver 330. The test signal generator 300 generates test signals based on the reference clock which the reference clock generator 200 has generated, and outputs these to the AND circuit 310. For example, the test signal generator 300 is a pattern-generating polynomial circuit such as a PRBS (Pseudo Random Bit Stream or Sequences) like an LFSR (Linear Feedback Shift Register).

The AND circuit 310 takes the AND of the control signal transmitted from the control signal transmitting unit 210 and the test signal generated by the test signal generating circuit 300, and outputs this to the OR circuit 320. That is to say, the AND circuit 310 transmits the test signal generated by the test signal generating circuit 300 to the OR circuit 320 in test operations where the logical value of the control signal is 1. On the other hand, in non-test operations where the logical value of the control signal is 0, the AND circuit 310 always outputs a logical value of 0 to the OR circuit 320. The OR circuit 320 then takes the OR of the transmission signals generated within the transmitting unit 30 in non-test operations and the output of the AND circuit 310, and outputs this to the driver 330. That is to say, in test operations, the OR circuit 320 outputs test signals output from the AND circuit 310 to the driver 330. On the other hand, in non-test operations, the OR circuit 320 outputs the transmission signals generated within the transmitting unit 30 to the driver 330. The driver 330 is an example of a transmitter according to the present invention, and transmits the transmission signals or test signals received from the OR circuit 320 to the receiving unit 40.

The receiving unit 40 has a receiver 400, variable delay controller 410, variable delay unit 420, test signal delay unit 430, anticipated value generating unit 440, anticipate value comparing unit 450, and a comparison result holding unit 460. The receiver 400 is an example of the receiver according to the present invention, and receives the transmitting signals or test signals transmitted by the driver 330. The variable delay control unit 410 controls the delay time of the reference clock with the variable delay unit 420. The variable delay control unit 410 may change the delay time each time instructed so by the test control device 20, or at predetermined timings. The variable delay unit 420 is a variable delay circuit for example, which generates a delay clock by delaying the reference clock received from the reference clock generator 200 based on the control of the variable delay control unit 410. Note that the variable delay unit 420 preferably has a variable range equal to or greater than the user interval which is the cycle of the data unit which the test signal includes.

The test signal delay unit 430 is a flip-flop circuit for example, for delaying the test signals which the receiver 400 has received based on the delay clock generated by the variable delay unit 420, and then outputting to the anticipated value comparing unit 450. The anticipated value generating unit 440 generates anticipated values of test signals to be received by the receiver 400, based on the reference clock generated by the reference clock generating unit 200, and outputs to the anticipated value comparing unit 450. The anticipated value comparing unit 450 sequentially compares the test signals output from the test signal delay unit 430 with the anticipated value generated by the anticipated value generating unit 440, and sequentially outputs comparison results indicating match or otherwise to the comparison result holding unit 460. The anticipated value comparing unit 450 is, for example, an XOR circuit for outputting the XOR of the test signals and the anticipated value. The comparison results between the test signal and anticipated value, which are sequentially output from the anticipated value comparing unit 450, are held in the comparison result holding unit 460 for a predetermined amount of time, and in the event that the anticipated value comparing unit 450 outputs at even a single comparison result indicating that the test signals and anticipated signals do not match within a predetermined amount of time, comparison results indicating that the test signals and anticipated signals do not match are output, and supplied to a comparison result storage unit 220.

Also, the test control device 20 further has the comparison result storage unit 220, an eye opening detecting unit 230, and a quality determining unit 240. The comparison result storage unit 220 stores the comparison results between the test signal and anticipated signal obtained from the anticipated value comparing unit 450 in a manner correlated with the delay time by which the test signal was delayed. The eye opening detecting unit 230 detects the range of delay time wherein the delayed test signal and anticipated value match as the eye opening, based on the comparison results of the delayed test signals and anticipated values for each delay time which the comparison result storage unit 220 stores. In the event that multiple eye openings are detected, the eye opening detecting unit 230 may take the narrowest eye opening of the multiple eye opening as the detection result. The quality determining unit 240 performs quality determination of at least one of the transmitting unit 30 and receiving unit 40, based on the eye opening which the eye opening detecting unit 230 has detected. Specifically, the quality determining unit 240 determines quality based on whether or not the eye opening is equal to or above a stipulated value determined beforehand.

Note that in FIG. 1, the variable delay unit 420 supplies the delay clock to the test signal delay unit 430, however, the present invention is not restricted to this arrangement, and an arrangement may be made wherein the variable delay unit 420 supplies the delay clock to the anticipated value generating unit 440, with the anticipated value generating unit 440 generating the anticipated value based on the delay clock. Also, an arrangement may be made wherein a flip-flop circuit is disposed between the anticipated value generating unit 440 and the anticipated value comparing unit 450, wherein the variable delay unit 420 supplies the delay clock to the flip-flop circuit, and the flip-flop circuit delays the anticipated value generated by the anticipated value generating unit 440 based on the delay clock, and supplies the delayed the anticipated value to the anticipated value comparing unit 450. Also, the communication device having the transmitting unit 30 or the receiving unit 40 may have the components of the test control device 20, and have Built-In Self-Test (BIST) functions.

With the testing system 10 according to the present embodiment, eye opening can be detected taking into consideration the effects of jitter properties, by comparing test signals with anticipated values while changing the delay time of the test signals. Thus, testing can be performed taking into consideration the effects of jitter properties, so test results with higher precision can be obtained. For example, defective communication devices wherein bit errors occur due to slight disturbance factors can be detected. Also, with the testing system 10 according to the present embodiment, the logic circuit of the transmitting unit 30 and receiving unit 40 can be operated at actual operating frequency, so already-existing IC testers can be used to realize so-called at-speed testing.

Also, with the test system 10 according to the present embodiment, the communication device having the transmitting unit 30 and the receiving unit 40 is a device to be tested, and is detachably provided to a test head of the testing apparatus including the test control device 20. That is to say, the receiving unit 40 which has the test signal delay unit 430, anticipated value comparing unit 450, and comparison result holding unit 460, of which are required high-speed operations, is provided detachably to the testing system 10. Accordingly, the test control device 20 can exhibit the desired functions even though operating at relatively low speeds, so the test control device 20 can be manufactured and provided relatively inexpensively.

Figures 2A, 2B:
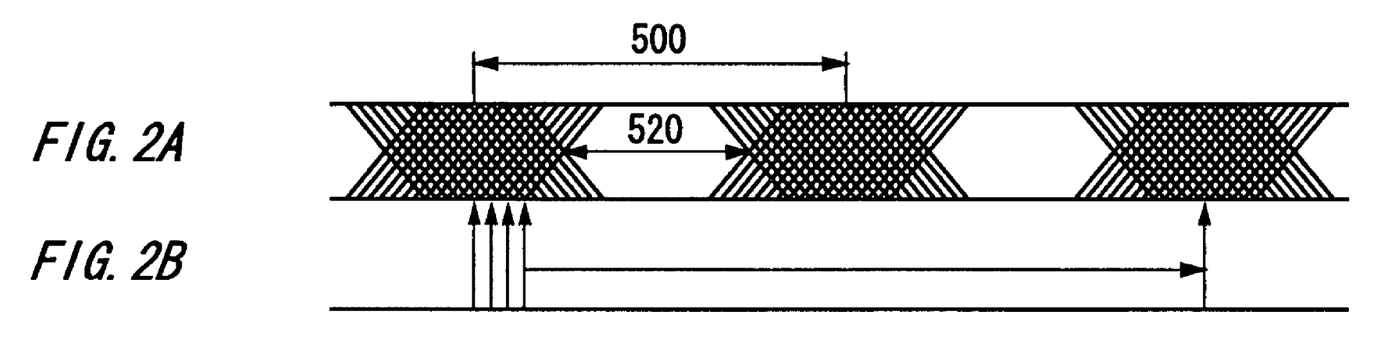
FIG. 2 is a diagram illustrating an example of an eye opening detecting method.
Figure 2C:
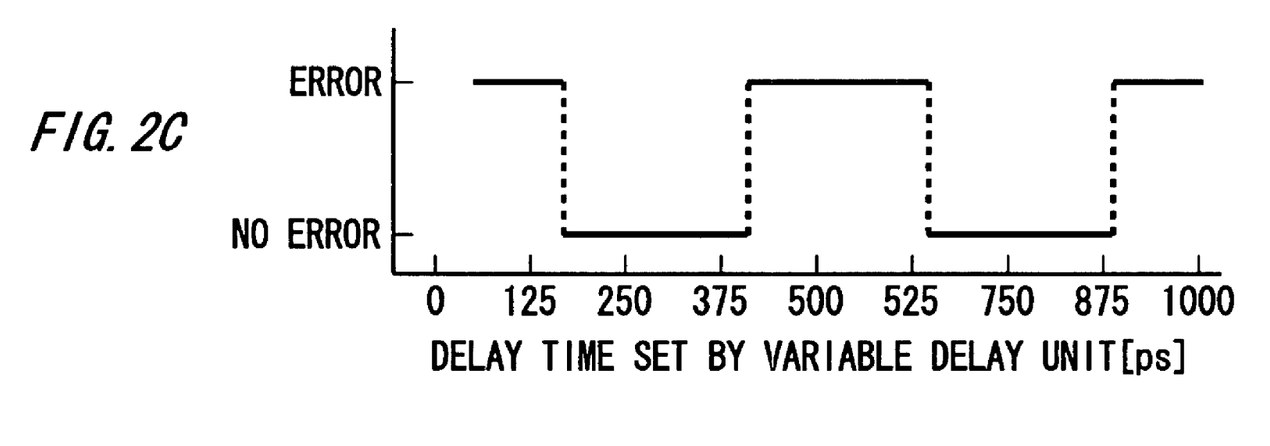

FIGS. 2A, 2B and 2C illustrate an example of the eye opening detection method according to the present embodiment. Symbol FIG. 2A illustrates an example of an eye diagram wherein multiple test signals received by the receiver 400 are overlaid. The receiver 400 receives signals wherein jitter components, owing to various disturbances, have been superimposed on the test signals generated by the test signal generating unit 300 and transmitted by the driver 330 in the transmitting unit 30.

FIG. 2B illustrates an example of a clock sweep of the delay clock generated by the variable delay unit 420. The test signal delay unit 430 delays the test signals received by the receiver 400, based on the delay clocks sequentially generated while the variable delay unit 420 changes the delay time thereof, and supplies the delayed test signals to the anticipated value comparing unit 450. The test signals are supplied to the anticipated value comparing unit 450 while changing the delay time. Thus, such an arrangement makes a comparison in a simulated manner between the test signals and the anticipated values at multiple different timings using multiple data units included in the test signals. For example, the variable delay unit 420 has resolution of the unit interval 500 divided equally into a number somewhere between ten to 100, and comparison between the test signal and anticipated value is performed just as many times for each unit interval 500. Specifically, in the event that the unit interval 500 is 500 ps, the variable delay unit 420 preferably has resolution of around 10 ps.

FIG. 2C illustrates an example of the relation between delay time set by the variable delay unit and the comparison results made by the anticipated value comparing unit 450. The comparison result storage unit 220 stores the comparison results of the anticipated value comparing unit 450 in a manner correlated with the delay time set by the variable delay unit which is the delay time set by the variable delay unit 420. Here, of the multiple different different timings of the multiple data units which the test signals contain, the comparison results by the anticipated value comparing unit 450 for timings where the test signal and the anticipated value do not match are represented with ERROR, and the comparison results by the anticipated value comparing unit 450 for timings where the test signal and the anticipated value match are represented with NO ERROR. The eye opening detecting unit 230 detects, as the eye opening 520, the range of delay time wherein the test signals and anticipated values match (NO ERROR) based on the comparison results at each delay time stored by the comparison result storing unit 220, i.e., the range of delay time wherein the jitter component does not affect transmission of test signals.

With the testing system 10 according to the present embodiment, comparison can be made in a simulated manner between the test signals and anticipated values at multiple different timings for the data units contained in the test signal by changing the delay time of the reference clock with the variable delay unit 420, and accordingly the eye opening 520 of the test signal can be accurately identified. Further, the quality of the communication device including the transmitting unit 30 and receiving unit 40 is determined based on the eye opening 520. This enables high-precision detection of unacceptable communication devices having a problem of bit error occurring due to slight disturbance factors.

Figure 3:
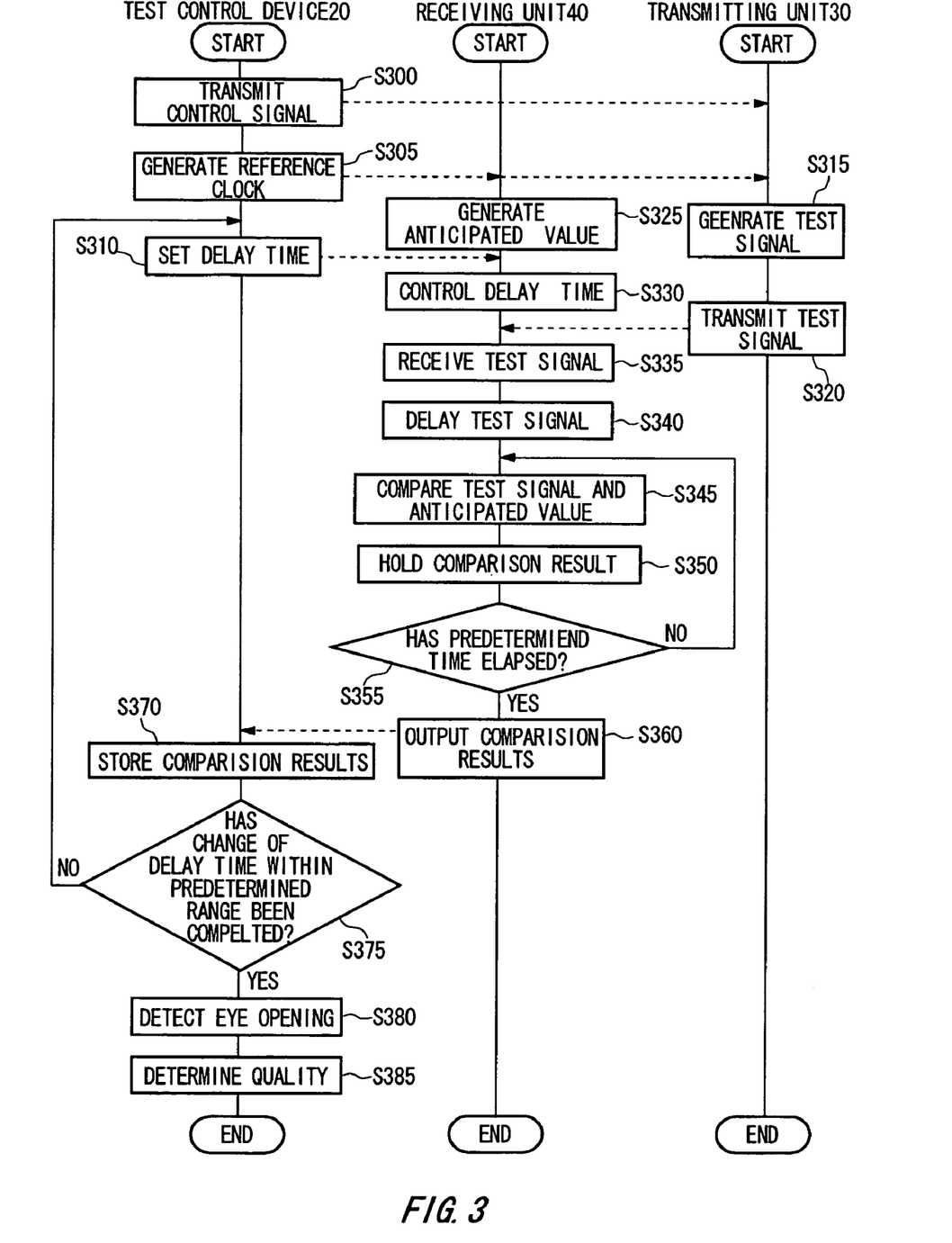
FIG. 3 is a diagram illustrating an example of a communication device testing method with the testing system 10.

FIG. 3 illustrates an example of a testing method for communication devices with the testing system 10 according to the present embodiment. First, at the test control device 20, the control signal transmitting unit 210 transmits a control signal to the transmitting unit 30, so as to transmit a test signal from the transmitting unit 30 (S300). Also, the reference clock generating unit 200 generates the reference clock, and supplies this to the transmitting unit 30 and the receiving unit 40 (S305). Also, the test control device 20 sets a delay time for the variable delay control unit 410 of the receiving unit 40 (S310).

Also, at the transmitting unit 30, upon receiving the reference clock form the reference clock generating unit 200, the test signal generating unit 300 generates test signals based on the reference clock. (S315). The driver 330 then transmits the test signal generated by the test signal generating unit 300 in S315 to the receiving unit 40 (S320).

Also, at the receiving unit 40, upon receiving the reference clock from the reference clock generating unit 200, the anticipated value generating unit 440 generates the anticipated value for the test signal which the receiver 400 is to received in S335, based on the reference clock (S325). Also, the variable delay control unit 410 controls the variable delay unit 420 based on the delay time set by the test control device 20, and the variable delay unit 420 generates a delay clock wherein the reference clock has been delayed (S330). The receiver 400 then receives the test signal which the driver 330 has transmitted in S320 (S335). The test signal delay unit 430 delays the test signal which the receiver 400 has received in S335 as to the reference clock (S340). The anticipated value comparing unit 450 then compares the test signal delayed in S340 with the anticipated value generated in S325, and outputs comparison results indicating whether matching or not (S345). The comparison result holding unit 460 then holds the comparison results from the anticipated value comparing unit 450 (S350).

Next, determination is made regarding whether a predetermined amount of time has elapsed since starting comparison between the anticipated value and the test signals delayed by a delay time which the test control device 20 has set to the variable delay control unit 410 (S355). In the event that determination is made that the predetermined time has not elapsed (No in S355), S345 and S350 are repeatedly performed while maintaining the delay time set by the variable delay unit 420. That is to say, the multiple data units contained in the test signal which the receiver 400 has received are sequentially compared with the anticipated values using the unit intervals 500 at the same timing in a predetermined period of time, and the comparison results are held. On the other hand, in the event that determination is made that the predetermined time has elapsed (Yes in S355), the comparison result holding unit 460 outputs comparison result indicating that the test signal and anticipated value do not match in the event that at least one of the multiple data units do not match, and outputs comparison result indicating that the test signal and anticipated value match in the event that all of the comparison results match (S360).

Next, at the test control device 20, the comparison result storing unit 220 stores the comparison results output from the comparison result holding unit 460 in S360, in a manner correlated with the delay time by which the test signal was delayed in S340 (S370). The test control device 20 determines whether or not change within the predetermined range of delay time set to the variable delay control unit 410 has been completed (S375). In the event that change within the predetermined range of delay time has not been completed (No in S375), the test control device 20 then sets a new delay time for the variable delay control unit 410, changes the delay time for the test signals by the variable delay unit 420, and performs S310 through S370 again. S310 through S370 are repeatedly executed while changing the delay time until change over the predetermined range in delay time is completed, i.e., up to a range equal to or exceeding the unit interval 500, and the comparison result storing unit 220 stores the comparison results for each delay time. In the event that change within the predetermined range of delay time has been completed (Yes in S375), the eye opening detecting unit 230 detects the range of delay time wherein the test signal delayed in S340 and the anticipated value generated in S325 match, based on the comparison results for each delay time stored in the comparison result storing unit 220, as the eye opening (S380). The quality determining unit 240 determines quality of the communication device containing the driver 330 or receiver 400, based on whether or not the eye opening detected in S380 is equal to or greater than the predetermined stipulated value (S385).

With the testing method according to the present embodiment, bit error owing to the jitter component can be accurately measured by comparing the test signal and anticipated value multiple times with the delay time of the test signal being constant, and then changing the delay time and comparing the test signal and anticipated value multiple times with the delay time of the test signal being constant, which is performed repeatedly.

Figure 4:
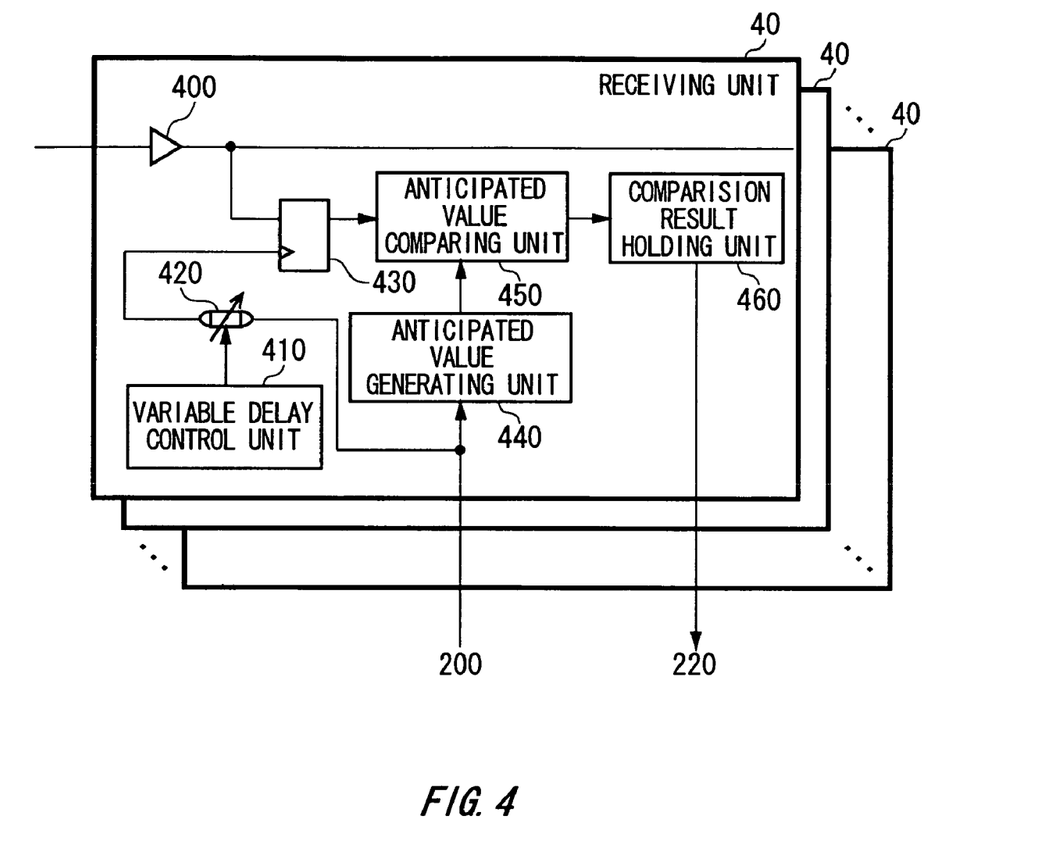
FIG. 4 is a diagram illustrating an example of the configuration of a communication device having multiple receiving units 40.
Figure 5:
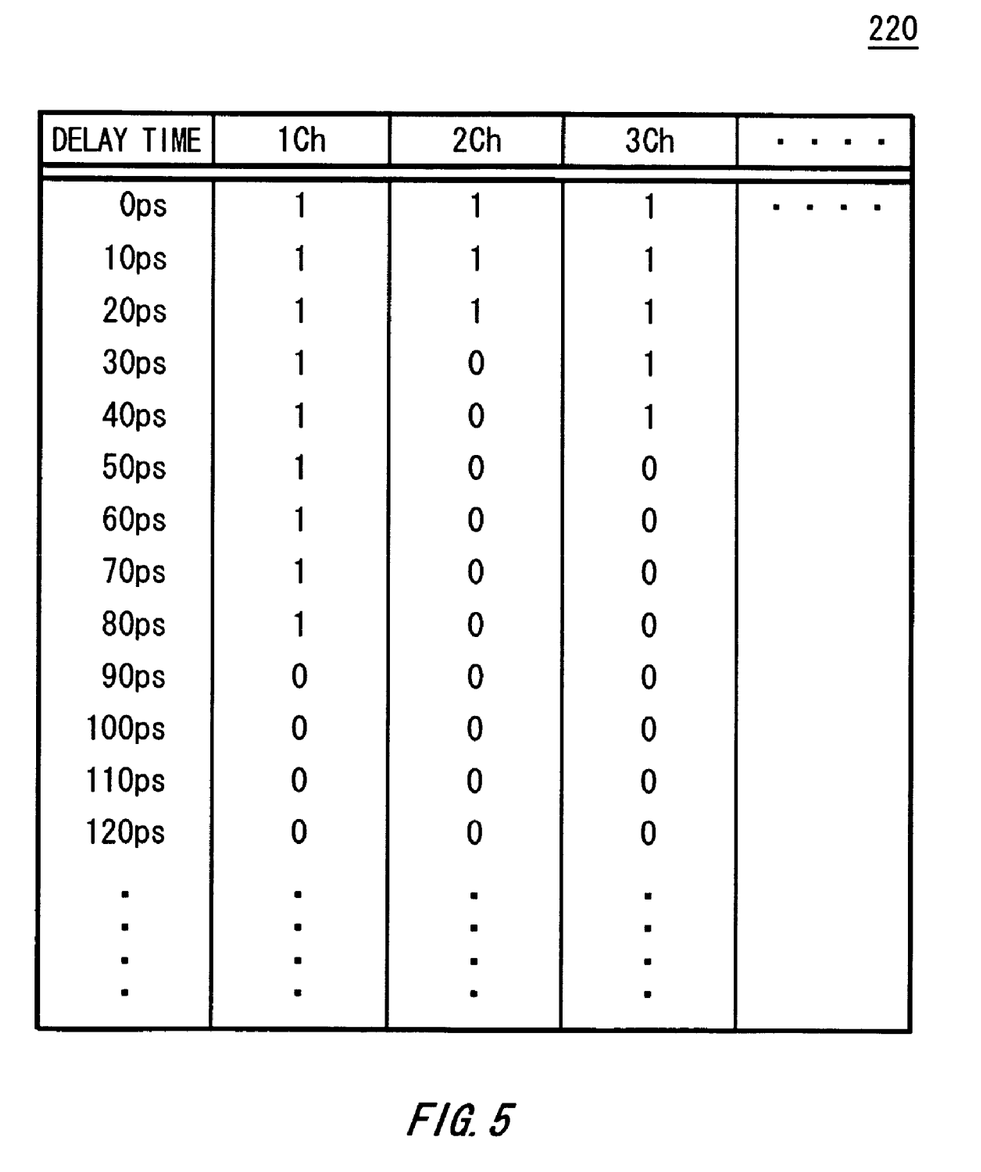
FIG. 5 is a diagram illustrating an example of the configuration of a comparison result storing unit 220.

FIG. 4 illustrates an example of the configuration of a communication device having multiple receiving units 40 according to the present embodiment. FIG. 5 illustrates an example of the configuration of the comparison result storing unit 220 according to the present embodiment. The testing system 10 may have multiple transmitting units 30 or multiple receiving units 40. That is to say, the testing system 10 may test a communication device having multiple transmitting units 30 or multiple receiving units 40. Each of the multiple transmitting units 30 and multiple receiving units 40 have the same configurations and functions as the transmitting unit 30 and the multiple receiving unit 40 shown in FIGS. 1 through 3, so description thereof will be omitted.

In S370, the comparison result storing unit 220 stores the comparison results between the anticipated values and the test signals output from each of the multiple comparison result holding units 460 which each of the multiple receiving units 40 has, correlated with the delay time by which the delay signals are delayed. In S380, the eye opening detecting unit 230 detects the range of delay time wherein the test signal delayed in S340 and the anticipated value match, at all of the multiple drivers 330 which each of the multiple transmitting units 30 have or the multiple receivers 400 which each of the multiple receiving units 40 have, as the eye opening, based on the comparison results with respect to the multiple drivers 330 or the multiple receivers 440 for each delay time. In step S385, the quality determining unit 240 performs quality determination for the communication device having the multiple transmitting units 30 or multiple receiving units 40, based on whether or not the eye opening detected by the eye opening detecting unit 230 is equal to or greater than the predetermined stipulated value.

Specifically, as shown in FIG. 5, the comparison result storing unit 220 stores the comparison results of the test signals and anticipated values for each delay time by the test signal delay unit 430, for each of the channels of the multiple derivers 330 or multiple receivers 400. With the present embodiment, the variable delay control unit 410 sets a delay time from 0 ps in increments of 10 ps. The steps S310 through S370 are repeated for each delay time. This shows that that for Channel 1, the comparison results do not match for the range of delay time 0 through 80 ps, shows that that for Channel 2 the comparison results do not match for the range of delay time 0 through 20 ps, and shows that that for Channel 3 the comparison results do not match for the range of delay time 0 through 40 ps. Accordingly, the eye opening detecting unit 230 detects 90 ps, which is the smallest delay time wherein the comparison results of all channels agree, as one end of the eye opening 520, based on the comparison results stored in the comparison result storing unit 220.

As described above, with the testing method according to the present embodiment, an eye opening 520 which can operate properly in all of the multiple channels can be detected in testing of a communication device having multiple transmitting units 30 or multiple receiving units 40. Accordingly, quality determination of communication devices having multiple transmitting units 30 or multiple receiving units 40 can be made with high precision.

Figure 6:
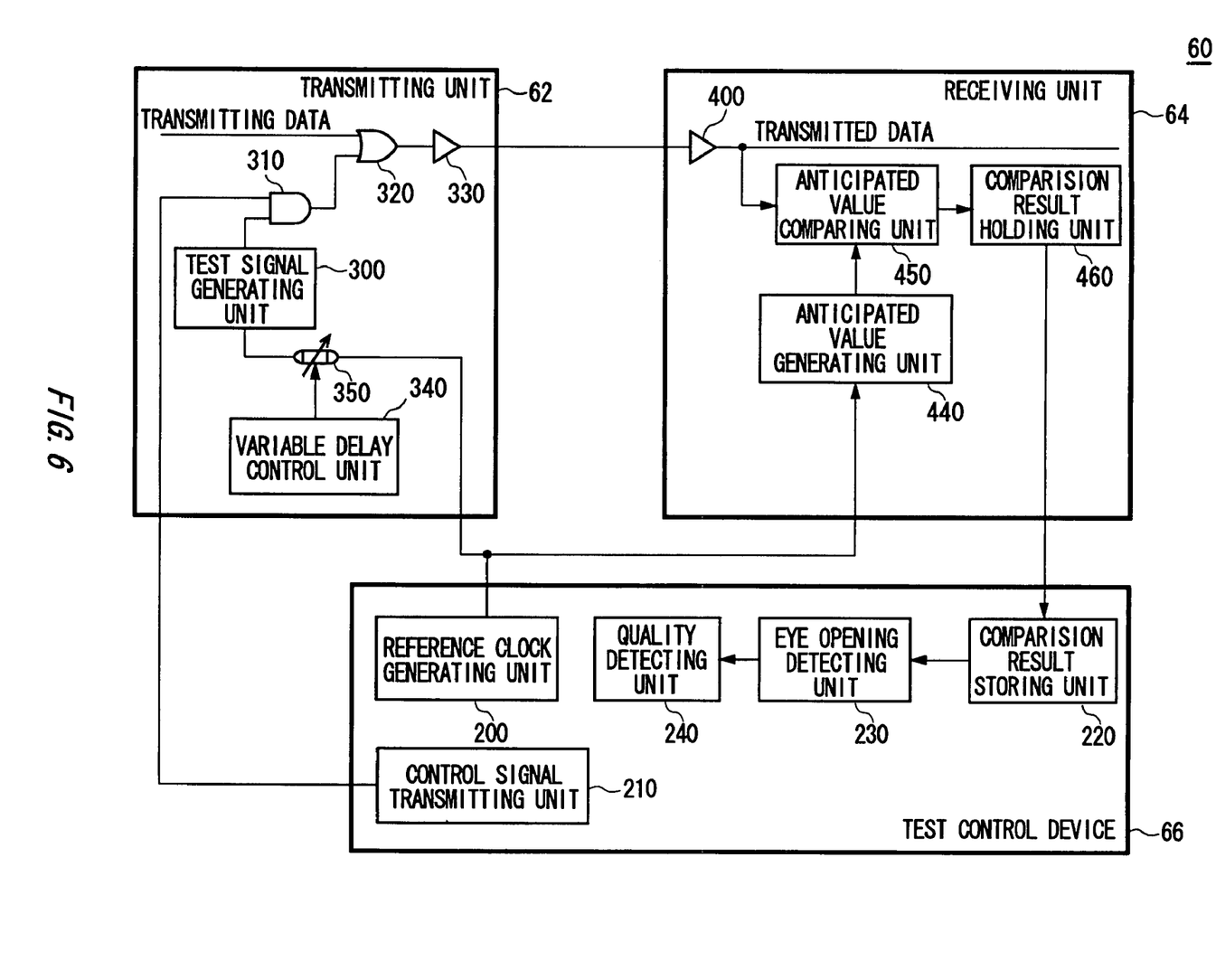
FIG. 6 is a diagram illustrating an example of the configuration of a testing system 60.

FIG. 6 illustrates an example of a testing system 60 according to a second embodiment of the present invention. With the testing system 10 according to the first embodiment, a test signal generated at the transmitting unit 30 based on a reference clock is delayed at the receiving unit 40 based on a delay clock, and is compared with an anticipated value generated based on the reference clock, thereby detecting the eye opening of the test signal, but with the testing system 60 according to the second embodiment, a test signal generated at a transmitting unit 62 based on a delay clock is compared with an anticipated value generated at a receiving unit 64 based on a reference clock, thereby detecting the eye opening of the test signal. Note that except for the following description, the testing system 60 according to the second embodiment has identical configuration and function as with the testing system 10 according to the first embodiment, so description thereof will be omitted.

The transmitting unit 62 has, in addition to the configuration of the transmitting unit 30 according to the first embodiment, a variable delay control unit 340 and variable delay unit 350. The variable delay control unit 340 controls the delay time of the reference clock by the variable delay unit 350. The variable delay control unit 340 may change the delay time each time there is an instruction from the test control device 20, or at predetermined timings. The variable delay unit 350 is a variable delay circuit for example, and delays a reference clock received from the reference clock generating unit 200 based on the control of the variable delay control unit 340, so as to generate a delay clock. Note that the variable delay unit 350 preferably has a range of change equal to or greater than the unit interval of the data units which the test signals contain. The test signal generating unit 300 then generates test signals based on the delay clock which the variable delay unit 350 has output. Thus, the test control device 66 repeatedly performs generating of test signals, transmitting of the test signals, receiving of the test signals, comparing of the test signals with anticipating values, and storing of the comparison results, while changing the delay time of the reference clock with the variable delay unit 350, and accordingly can detect eye opening taking into consideration the effects of jitter properties, in the same way as with the test control device 20 according to the first embodiment.

Now, while the test signal generating unit 300 shown in FIG. 6 generates test signals based on the delay clock generated by the variable delay unit 350, in another example, a flip-flop circuit may be disposed between the test signal generating unit 300 and the driver 330, wherein the variable delay unit 350 supplies the generated delay clock to the flip-flop circuit, and the flip-flop circuit delays the test signal which the test signal generating unit 300 has generated based on the reference clock, based on the delay clock and supplies the delay clock to the driver 330.

Also, with the test system 60 according to the present embodiment, the communication device having the transmitting unit 62 and the receiving unit 64 is a device to be tested, and is detachably provided to a test head of the testing apparatus including the test control device 66. That is to say, the receiving unit 64 which has the anticipated value comparing unit 450 and comparison result holding unit 460, of which are required high-speed operations, is provided detachably to the testing system 60. Accordingly, the test control device 66 can exhibit the desired functions even though operating at relatively low speeds, so the test control device 66 can be manufactured and provided relatively inexpensively.

Figure 7:
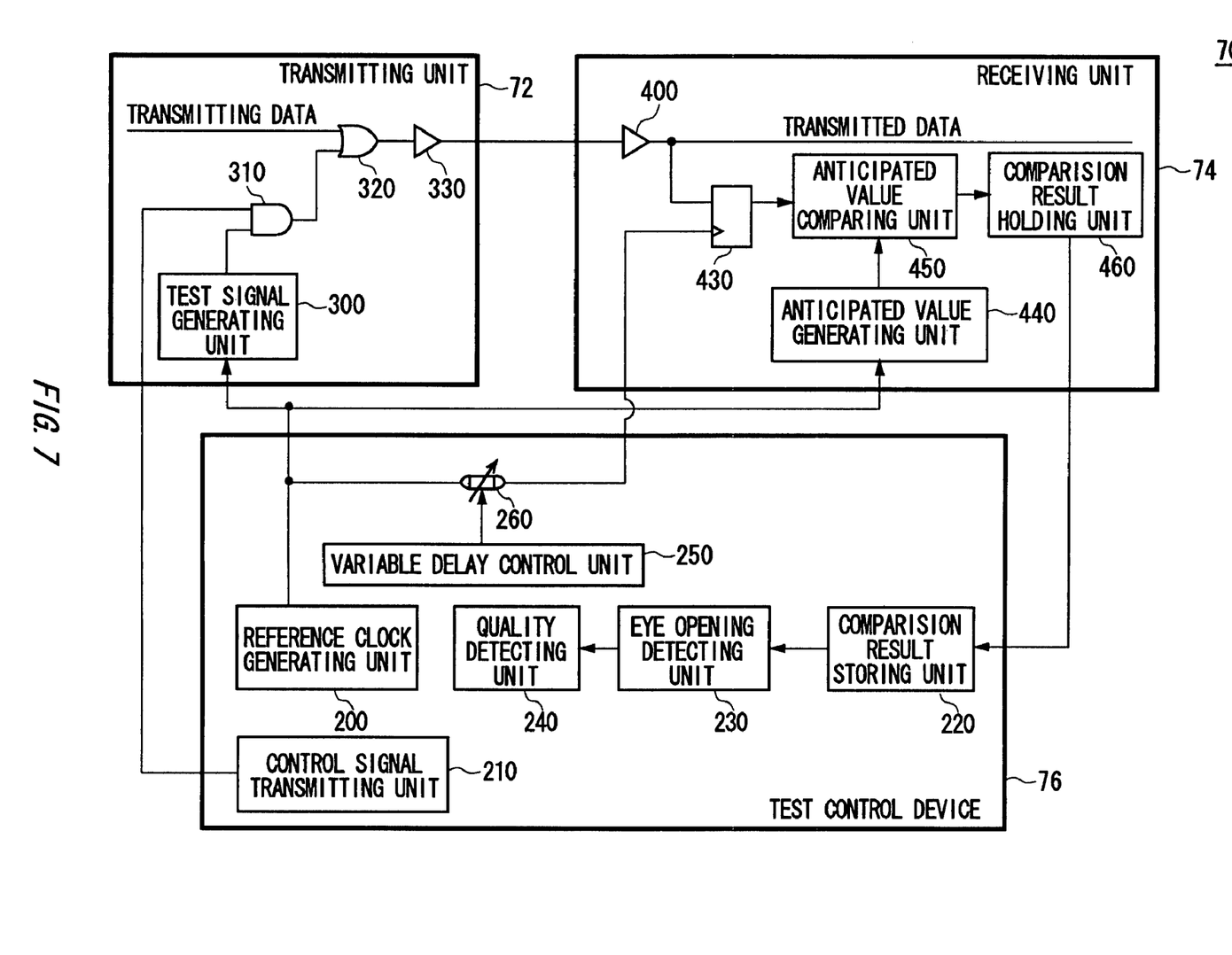
FIG. 7 is a diagram illustrating an example of the configuration of a testing system 70.

FIG. 7 illustrates an example of the configuration of a testing system 70 according to a third embodiment of the present invention. With the testing system 10 according to the first embodiment, the receiving unit 40 has a variable delay control unit 410 and variable delay unit 420, with the variable delay unit 420 delaying the reference clock generated by the reference clock generating unit 200 to generate a delay clock which is supplied to the test signal delay unit 430. With the testing system 70 according to the third embodiment, a test control unit 76 has a variable delay control unit 250 and variable delay unit 260, with the variable delay unit 260 delaying the reference clock generated by the reference clock generating unit 200 to generate a delay clock which is supplied to the test signal delay unit 430 included in the receiving unit 74. Note that except for the following description, the testing system 70 according to the third embodiment has identical configuration and function as with the testing system 10 according to the first embodiment, so description thereof will be omitted.

The test control device 76 has, in addition to the configuration of the test control device 20 according to the first embodiment, a variable delay control unit 250 and variable delay unit 260. The variable delay control unit 250 controls the delay time of the reference clock by the variable delay unit 260. The variable delay control unit 250 may change the delay time at predetermined timings. The variable delay unit 260 is a variable delay circuit for example, and delays a reference clock received from the reference clock generating unit 200 based on the control of the variable delay control unit 250, so as to generate a delay clock. Note that the variable delay unit 260 preferably has a range of change equal to or greater than the unit interval of the data units which the test signals contain. The test signal generating unit 430 then delays the test signals which the receiver 400 of the receiving unit 74 has received, based on the delay clock which the variable delay unit 260 has generated, and outputs to the anticipated value comparing unit 450. Thus, the test control device 76 has the variable delay control unit 250 and variable delay unit 260 and generates a delay clock while changing the delay time of the reference clock, and accordingly, the test control device 76 can detect eye opening taking into consideration the effects of jitter properties for communication devices which do not have the variable delay control unit and variable delay unit as well, in the same way as with the test control device 20 according to the first embodiment.

Now, while the variable delay unit 260 in FIG. 7 supplies the delay clock to the test signal delay unit 430, in another example, the variable delay unit 260 may supply the delay clock to the anticipated value generating unit 440, with the anticipated value generating unit 440 generating anticipated values based on the delay clock. Also, an arrangement may be made wherein a flip-flop circuit is disposed between the anticipated value generating unit 440 and the anticipated value comparing unit 450, wherein the variable delay unit 420 supplies the delay clock to the flip-flop circuit, and the flip-flop circuit delays the anticipated value generated by the anticipated value generating unit 440 based on the delay clock, and supplies the delayed anticipated value to the anticipated value comparing unit 450. Also, the variable delay unit 260 may supply the delay clock to the test signal generating unit 300, with the test signal generating unit 300 generating test signals based on the delay clock. Also, a flip-flop circuit may be disposed between the test signal generating unit 300 and the driver 330, with the variable delay unit 260 supplying the generated delay clock to the flip-flop circuit, and the flip-flop circuit delaying the test signal which the test signal generating unit 300 has generated based on the reference clock, based on the delay clock, and supplying the delayed test signal to the driver 330.

Also, with the test system 70 according to the present embodiment, the communication device having the transmitting unit 72 and the receiving unit 74 is a device to be tested, and is detachably provided to a test head of the testing apparatus including the test control device 76. That is to say, the receiving unit 74 which has the test signal delay unit 430, anticipated value comparing unit 450, and comparison result holding unit 460, of which are required high-speed operations, is provided detachably to the testing system 70. Accordingly, the test control device 76 can exhibit the desired functions even though operating at relatively low speeds, so the test control device 76 can be manufactured and provided relatively inexpensively.

While description has been made regarding the present invention with reference to the embodiments, the technical scope of the present invention is not restricted to the precise embodiments described above. Various changes and modifications may be made. It is needless to say that such various changes and modifications are also encompassed in the technical scope of the present invention as defined in the appended claims.

According to the testing method of the present invention, comparing test signals and anticipated values while changing the delay time of the test signals enables eye opening detection to be performed taking into consideration the effects of jitter properties, and quality determination of communication devices can be performed with precision, based on the eye opening.

What is claimed is:

1. A testing method for testing a communication device, said method comprising:
    a reference clock generating step for generating a reference clock;
    a test signal generating step for generating a test signal based on said reference clock;
    a transmitting step for transmitting, with a transmitting unit, said test signal generated in said test signal generating step;
    a receiving step for receiving, with a receiving unit, said test signal which said transmitting unit has transmitted in said transmitting step;
    an anticipated value generating step for generating, based on said reference clock, an anticipated value for said test signal which said receiving unit is to receive in said receiving step; a delay step for delaying said test signal which said receiving unit has received in said receiving step, as to said reference clock;
    a comparing step for comparing said test signal delayed in said delay step with said anticipated value generated in said anticipated value generating step, and outputting comparison results indicating matching or not matching;
    a comparison result storing step for storing said comparison results in said comparing step in a manner correlated with the delay time by which said test signal was delayed in said delay step;
    a repetition step for repeatedly performing said delay step, said comparing step, and said comparison result storing step, while changing said delay time for delaying said test signal in said delay step, and storing said comparison results for each delay time;
    a detecting step for detecting a range wherein said test signal delayed in said delay step and said anticipated value generated in said anticipated value generating step match, based on said comparison results for each delay time stored in said repetition step; and
    a determining step for determining quality of said receiving unit or said transmitting unit, based on the range of said delay time detected in said detecting step.

2. The testing method according to claim 1, wherein said repetition step further comprises a step for changing said delay time for delaying said test signal in said delay step at predetermined timings;
    and wherein said comparing step further comprises a step for sequentially comparing a plurality of data units which said test signal contains with said anticipated value;
    and wherein said comparison result storing step further comprises a step for storing, in the event that at least one of said plurality of data units does not match said anticipated value, said comparison results indicating that said test signal received by said receiving unit in said receiving step does not match said anticipated value.

3. The testing method according to claim 1, wherein said repetition step further comprises a step for changing said delay time for said delay in said delay step over a range equal to or greater than the cycle of data units which said test signal, generated in said test signal generating step, contains.

4. The testing method according to claim 1, wherein said determining step further comprises a step for determining quality of said receiving unit or said transmitting unit based on whether or not the range of said delay time detected in said detecting step is equal to or greater than a predetermined stipulated value.

5. The testing method according to claim 1, said detecting step further comprising a step for detecting, in an arrangement wherein said communication device comprises a plurality of said receiving units or a plurality of said transmitting units, the range of said delay time in which said test signal delayed in said delay step and said anticipated value generated in said anticipated value generating step match at all of said plurality of receiving units or said plurality of transmitting units, based on said comparison results for each delay time regarding said plurality of receiving units or said plurality of transmitting units.

6. A testing method for testing a communication device, said method comprising:
    a reference clock generating step for generating a reference clock;
    a delay clock generating step for generating a delay clock by delaying said reference clock;
    a test signal generating step for generating a test signal based on said delay clock;
    a transmitting step for a transmitting unit to transmit said test signal generated in said test signal generating step;
    a receiving step for a receiving unit to receive said test signal transmitted by said transmitting unit in said transmitting step;
    an anticipated value generating step for generating, based on said reference clock, an anticipated value of said test signal to be received by said receiving unit in said receiving step;
    a comparing step for comparing said test signal which said receiving unit has received in said receiving step with said anticipated value generated in said anticipated value generating step, and outputting comparison results indicating matching or not matching;

a comparison result storing step for storing said comparison results in said comparing step in a manner correlated with the delay time by which said reference clock was delayed in said delay clock generating step;

a repetition step for repeatedly performing said test signal generating step, said transmitting step, said receiving step, said comparing step, and said comparison result storing step, while changing said delay time for delaying said reference clock in said delay clock generating step, and storing said comparison results for each delay time;

a detecting step for detecting a range wherein said test signal which said receiving unit has received in said receiving step and said anticipated value generated in said anticipated value generating step match, based on said comparison results for each delay time stored in said repetition step; and a determining step for determining quality of said receiving unit or said transmitting unit, based on the range of said delay time detected in said detecting step.

7. A communication device comprising:

a receiving unit for receiving test signals generated based on a reference clock;

a variable delay unit for generating a delay clock by delaying said reference clock, while sequentially changing the delay time;

a test signal delay unit for delaying said test signals which said receiving unit has received, based on said delay clock generated by said variable delay unit;

an anticipated value generating unit for generating, based on said reference clock, an anticipated value for a test signal to be received by said receiving unit; and an anticipated value comparing unit for sequentially comparing said test signals delayed by said test signal delay unit and said anticipated value generated by said anticipated value generating unit, and sequentially outputting comparison results indicating matching or not matching.

8. The communication device according to claim 7, further comprising:

a variable delay control unit for changing said delay time of said reference clock by said variable delay unit at predetermined timings; and a comparison result holding unit for holding said comparison results sequentially output from said anticipated value comparing unit for each said predetermined time, and in the event that said anticipated value comparing unit outputs at least one comparison result indicating that said test signals and said anticipated value do not match within said predetermined time, outputting said comparison results indicating that said test signals do not match said anticipated value.

9. The communication device according to claim 8, further comprising:

an eye opening detecting unit for detecting a range of delay time in which said test signals delayed by said test signal delay unit and said anticipated value generated by said anticipated value generating unit match, based on the comparison results for each said delay time output from said comparison result holding unit; and a quality determining unit for determining the quality of said communication device, based on the range of said delay time detected by said eye opening detecting unit.

10. The communication device according to claim 7, wherein said variable delay unit has a variable range equal to or greater than the cycle of data units contained in said test signals received by said receiving unit.

11. The communication device according to claim 7, further comprising:

a reference clock generating unit for generating said reference clock;

a test signal generating unit for generating said test signals based on said reference clock generated by said reference clock generating unit; and a transmitting unit electrically connected to said receiving unit, for transmitting said test signals generated by said test signal generating unit to said receiving unit.

12. communication device comprising:

a variable delay unit for generating a delay clock by delaying a reference clock while sequentially changing the delay time;

a test signal generating unit for generating a test signal based on said delay clock;

a transmitting unit for transmitting said test signal generated by said test signal generating unit;

a receiving unit electrically connected to said transmitting unit, for receiving said test signal transmitted by said transmitting unit; an anticipated value generating unit for generating, based on said reference clock, an anticipated value for said test signal to be received by said receiving unit; and an anticipated value comparing unit for sequentially comparing said test signal received by said receiving unit with said anticipated value generated by said anticipated value generating unit, and sequentially outputting comparison results indicating whether matching or not matching.

13. A test system which transmits test signals generated based on a reference clock for testing a transmitting unit, said test system comprising:

a receiving unit for receiving said test signals transmitted by said transmitting unit;

a variable delay unit for generating a delay clock by delaying said reference clock, while sequentially changing the delay time;

a test signal delay unit for delaying, based on said delay clock generated by said variable delay unit, said test signals received by said receiving unit;

an anticipate value generating unit for generating, based on said reference clock, an anticipated value for said test signals to be received by said receiving unit;

an anticipated value comparing unit for sequentially comparing said test signals delayed by said test signal delay unit with said anticipated value generated by said anticipated value generating unit, and sequentially outputting comparison results indicating whether matching or not matching;

a variable delay control unit for changing said delay time for delaying said reference clock by said variable delay unit, at predetermined timings;

a comparison result holding unit for holding said comparison results sequentially output from said anticipated value comparing unit for each said predetermined time, and in the event that said anticipated value comparing unit outputs at least one comparison result indicating that said test signals and said anticipated value do not match within said predetermined time, outputting said comparison results indicating that said test signals do not match said anticipated value;

an eye opening detecting unit for detecting a range of delay time in which said test signals delayed by said test signal delay unit and said anticipated value generated by said anticipated value generating unit match, based on the comparison results for each said delay time output from said comparison result holding unit; and a quality determining unit for determining the quality of said transmitting unit, based on the range of said delay time detected by said eye opening detecting unit.

14. The testing system according to claim 13, further comprising a receiving unit having said receiving unit, said anticipated value comparing unit, and said comparison result holding unit;

wherein said receiving unit is provided detachably to said testing system.

* * * * *